US009093569B2

United States Patent
Eom

(10) Patent No.: US 9,093,569 B2
(45) Date of Patent: Jul. 28, 2015

(54) SEMICONDUCTOR DEVICE AND METHOD FOR MANUFACTURING THE SAME

(71) Applicant: SK hynix Inc., Icheon-si (KR)

(72) Inventor: Hee Sun Eom, Seoul (KR)

(73) Assignee: SK HYNIX INC., Icheon (KR)

( * ) Notice: Subject to any disclaimer, the term of this patent is extended or adjusted under 35 U.S.C. 154(b) by 71 days.

(21) Appl. No.: 13/710,421

(22) Filed: Dec. 10, 2012

(65) Prior Publication Data

US 2013/0168814 A1 Jul. 4, 2013

(30) Foreign Application Priority Data

Dec. 30, 2011 (KR) ........................ 10-2011-0140718

(51) Int. Cl.
*H01L 27/108* (2006.01)
*H01L 29/94* (2006.01)
*H01L 29/66* (2006.01)
*H01L 49/02* (2006.01)
*H01L 23/522* (2006.01)
*H01L 27/02* (2006.01)

(52) U.S. Cl.
CPC ............ *H01L 29/94* (2013.01); *H01L 23/5223* (2013.01); *H01L 28/40* (2013.01); *H01L 29/66181* (2013.01); *H01L 27/0207* (2013.01)

(58) Field of Classification Search
CPC ..................... H01L 21/7687; H01L 23/49589; H01L 23/5223; H01L 27/0288; H01L 27/0629–27/0805; H01L 27/101; H01L 27/10811–27/1082; H01L 27/10829–27/10861; H01L 28/40; H01L 29/66174
See application file for complete search history.

(56) References Cited

U.S. PATENT DOCUMENTS

| | | | | |
|---|---|---|---|---|
| 6,033,951 | A * | 3/2000 | Chao .............................. | 438/253 |
| 2004/0207004 | A1* | 10/2004 | Tamura ......................... | 257/315 |
| 2009/0014832 | A1* | 1/2009 | Baumgartner et al. ........ | 257/532 |
| 2009/0184393 | A1* | 7/2009 | Chen et al. .................... | 257/532 |
| 2010/0159668 | A1 | 6/2010 | Shin | |
| 2012/0043595 | A1* | 2/2012 | Chang et al. .................. | 257/296 |
| 2012/0132968 | A1 | 5/2012 | Choi | |

FOREIGN PATENT DOCUMENTS

KR 101061353 B1 8/2011
KR 1020120058327 A 6/2012

* cited by examiner

*Primary Examiner* — David Vu
*Assistant Examiner* — Cuong Nguyen

(57) ABSTRACT

In a semiconductor device and a method for manufacturing the same, a mesh shaped lower electrode of a peripheral region is used as a reservoir capacitor to increase the size of a region contacting a dielectric film, such that Cs deterioration is minimized. An exemplary semiconductor device may include a line-type storage node contact plug formed over a semiconductor substrate, a mesh shaped lower electrode formed over the storage node contact plug, and a dielectric film and an upper electrode formed over the lower electrode.

11 Claims, 2 Drawing Sheets

(12) United States Patent

SEMICONDUCTOR DEVICE AND METHOD FOR MANUFACTURING THE SAME

CROSS-REFERENCE TO RELATED APPLICATION

The priority of Korean patent application No. 10-2011-0140718 filed on 30 Dec. 2011, the disclosure of which is hereby incorporated in its entirety by reference, is claimed.

BACKGROUND OF THE INVENTION

Embodiments of the present invention relate to a semiconductor device and a method for manufacturing the same.

A variety of power sources are available for operating a capacitor in a cell region and other elements in a peripheral region. Operation of the power sources produces noise. In order to reduce such noise, reservoir capacitors have been widely used. Such reservoir capacitors can be formed either in the cell region or in the peripheral region.

Generally, the reservoir capacitor uses a MOS-type capacitor comprising a gate and a source/drain. One reason why the MOS-type capacitor is used is that a gate oxide film has superior inner pressure characteristics with respect to a voltage applied thereto. However, with the increasing integration degree of semiconductor devices, the area of the MOS-type capacitor formed in the semiconductor device needs to be reduced.

Since capacitance of the MOS-type capacitor is reduced in proportion to such reduction in a size of the capacitor, it is difficult for a MOS-type capacitor to be used as a reservoir capacitor for a highly integrated device. That is, while the conventional MOS-type capacitor has superior inner pressure characteristics, it has low electrostatic capacitance when it is employed for a semiconductor device with a small unit cell size. Thus, a MOS-type capacitor is not desirable as a reservoir capacitor in a highly-integrated semiconductor device.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device in which a cylindrical or concaved lower electrode of a cell region and a checkered, meshed, matrix-type or lattice-type lower electrode of a peripheral region is used as a reservoir capacitor so as to increase the size of a region contacting a dielectric film, such that Cs deterioration is minimized, and a method for manufacturing the same.

In accordance with an aspect of the present invention, a reservoir capacitor for a semiconductor device includes a line-type wiring layer formed over a semiconductor substrate; a meshed-type lower electrode formed over the wiring layer; and a dielectric film and an upper electrode formed over the lower electrode.

The reservoir capacitor may further include a MOS-type capacitor formed between the semiconductor substrate and the wiring layer.

The wiring layer may include storage node contact plug of cell region and peri region.

The wiring layer may include polysilicon.

The reservoir capacitor may further include a contact coupled to each of the upper electrode and the wiring layer.

The lower electrode may be formed in a meshed, checkered, matrix-type, or lattice-type structure.

The lower electrode may be formed of titanium (Ti) or a laminated structure of titanium (Ti) and titanium nitride (TiN).

In accordance with another aspect of the present invention, a method for manufacturing a reservoir capacitor of a semiconductor device includes forming a MOS-type capacitor over a semiconductor substrate; forming a line-type wiring layer over the MOS-type capacitor; forming a meshed-type lower electrode over the wiring layer; and forming a dielectric film and an upper electrode over the lower electrode.

The wiring layer may include storage node contact plug of cell region and peri region.

The wiring layer may include polysilicon.

The method may further include a contact coupled to each of the upper electrode and the wiring layer.

The lower electrode may be formed in a meshed, checkered, matrix-type, or lattice-type structure.

The lower electrode may be formed of titanium (Ti) or a laminated structure of titanium (Ti) and titanium nitride (TiN).

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the appended drawings.

Figure 1:
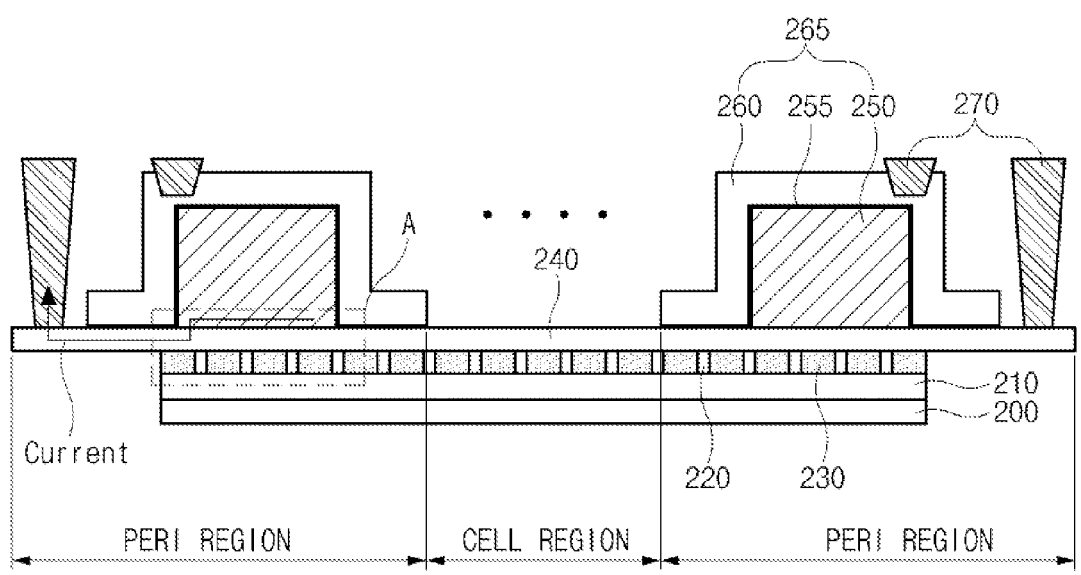
FIG. 1 is a cross-sectional view illustrating a method for manufacturing a semiconductor device according to an embodiment of the present invention.

FIG. 1 is a cross-sectional view illustrating a method for manufacturing a semiconductor device according to an embodiment of the present invention.

Referring to FIG. 1, a metal oxide silicon (MOS) capacitor 210 is formed over a semiconductor substrate 200. FIG. 1 shows an exaggerated view of a semiconductor substrate. Thus, the FIG. 1 represents an entire semiconductor, where the central portion of the figure is the cell region, and edge portions are peripheral regions. In an embodiment, the MOS capacitor 210 may be formed in the cell region, and in the peripheral regions.

In an embodiment, in order to form the MOS capacitor 210 includes a first metal electrode (not shown), a dielectric film (not shown), and a second metal electrode (not shown) are formed over the semiconductor substrate 200. The first and second metal electrodes may include tungsten (W), titanium (Ti), titanium nitride (TiN), polymer, cobalt (Co) or nickel (Ni). The MOS capacitor 210 in either of the cell region and the peripheral region may be (i) a gate, a source/drain region, a bit line, or (ii) a contact coupled to the gate, the source/drain region, or the bit line.

An insulation film 220 is formed over the MOS capacitor 210. The insulation film 220 comprise one selected from the group consisting of HDP (High Density Plasma), BPSG (Boron Phosphorus Silicate Glass), PSG (Phosphorus Silicate Glass), BSG (Boron Silicate Glass), TEOS (Tetra Ethyle Ortho Silicate), USG (Un-doped Silicate Glass) and combinations thereof.

After forming a photoresist film over the insulation film 220, a photoresist pattern (not shown) is formed by an exposure and development process using a mask defining a contact plug.

Thereafter, the insulation film 220 is etched using the photoresist pattern as an etch mask, resulting in formation of a contact hole (not shown). A conductive material or polysilicon is buried in the contact hole, such that a contact plug 230 is formed. In embodiments, the contact plug 230 may be a landing plug, a bit line contact plug, or any contact coupled to an element in the MOS capacitor 210. In the peripheral region, the contact plug 230 may be a peri-bit line contact plug. The peri-bit line contact may be directly coupled to the semiconductor substrate 200 or indirectly coupled to the semiconductor substrate 200, for example, via a peri-gate.

A wiring layer 240 is formed over and coupled to the contact plug 230 layer. The wiring layer 240 may be formed as a line type and may be storage node contact plug of cell region and peri region.

Thereafter, a reservoir capacitor 265 is formed over the wiring layer 240. The reservoir capacitor 265 may be formed to include a lower electrode 250, a dielectric film 255, and an upper electrode 260. In embodiments, The lower electrode 250 may be formed, for example, as a cross type, a meshed type, a matrix type or a lattice type. The lower electrode 250 may be formed of titanium (Ti) or a laminated structure of titanium (Ti) and titanium nitride (TiN).

Next, a metal contact plug 270 coupled to the wiring layer 240 and the upper electrode 260 is formed.

Figure 2:
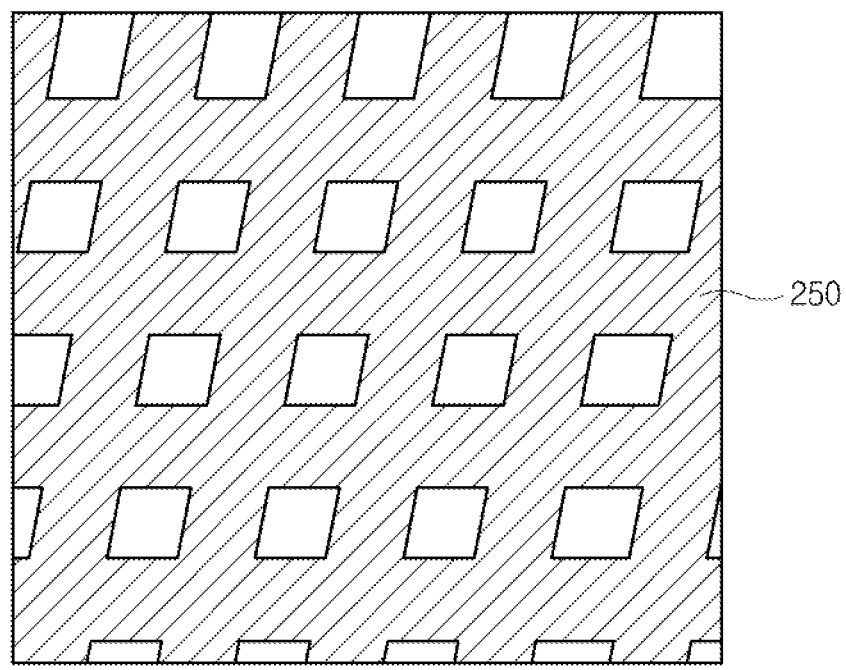
FIG. 2 is a plan view illustrating a method for manufacturing a semiconductor device according to an embodiment of the present invention.

FIG. 2 is a plan view illustrating a method for manufacturing a semiconductor device according to an embodiment of the present invention.

Referring to FIG. 2, the lower electrode 250 formed, for example, as a cross type, a meshed type, a matrix type or a lattice type is formed in a peripheral region. The lower electrode 250 which is formed of the line-type conductive material is used as a reservoir capacitor. Each of the lower electrodes 250 is coupled with a plurality of contact plugs 230 of FIG. 1 via the wiring layer 240 of FIG. 1

In the present embodiment where the single lower electrode 250 is coupled to a plurality of contact plugs 230 through the wiring layer 240, when a current is transmitted from/to the metal contact 270 to/from a first end of the lower electrode 250 which is at the farthest point from the metal contact plug 270, a current path between the first end and a second end which is at the opposite point of the first end and at the nearest point from the metal contact plug 270 is formed through the lower electrode 250, rather than through the wiring layer 240.

In the present embodiment where a first metal contact plug 270 coupled to the upper electrode, and a second metal contact plug 270 coupled to the wiring layer. In embodiments, the first and the second metal contact plugs 270 may include a first reservoir capacitor contact plug and a second reservoir capacitor contact plug.

In contrast, in the conventional structure where a single lower electrode (corresponding to the lower electrode 250 of the present embodiment) is coupled to a single contact plug (corresponding to the contact plug 230 of the present embodiment) through a single storage node contact plug (corresponding to the wiring layer 240 of the present embodiment), the current path between a first lower electrode (corresponding to the lower electrode 250 of the present embodiment) disposed at the farthest point from a metal contact plug (corresponding to the metal contact plug 270 of the present embodiment) and a second lower electrode (corresponding to the lower electrode 250 of the present embodiment) disposed at the nearest point from the metal contact plug is formed through a single storage node contact plug (corresponding to the wiring layer 240 of the present embodiment).

When the wiring layer 240 is formed of a conductive material whose conductivity is lower than that of a conductive material forming of the lower electrode 250, the current path under present embodiment is more effective to prevent parasitic capacitance, and reduce resistance.

That is, instead of using a conventional current path formed via the wiring layer 240, the current path of an embodiment of the present invention need not to involve the wiring layer 240 because the lower electrode 250 is configured in a cross-type or a matrix-type (lattice-type) so that a single lower electrode 250 can be coupled to a plurality of contact plugs 230 via the wiring layer 240. As a result, Cs deterioration is minimized. Also, under this configuration, a surface area of a dielectric film can be increased as well.

Although embodiments of the lower electrode 250 have been described as using a line-type conductive material to form a cross, meshed, matrix, or lattice type of pattern, it may be helpful to further explain the shape of the lower electrode 250. As seen in FIG. 2, the lower electrode 250 may comprise crossed line patterns. The grid of crossed lines can be described as a mesh, a matrix, or a lattice. The grid may be described as a contiguous electrode layer interrupted by a plurality of holes, as seen in FIG. 2.

Accordingly, the lower electrode 250 may comprise a contiguous matrix of electrode material providing an electrical path between an edge of a plurality of capacitors 265 sharing the lower electrode 250 and a metal contact plug 270 disposed in a peripheral region of a device. In an embodiment, all of the capacitors 265 sharing a contiguous lower electrode 250 are disposed in a peripheral region.

In an embodiment, the upper electrode 260 covers the entire exposed upper surface of the mesh shaped lower electrode 250. In other words, the upper electrode 260 may be formed in the same mesh shape as the lower electrode, an example of which is shown in FIG. 2. A mesh shaped upper electrode 260 works together with the lower electrode 250 to prevent parasitic capacitance in the peripheral region.

Advantages of such a lower electrode 250 may include forming a current path with a lower resistance between the lower electrode 250 and a metal contact plug 270. In order for current to flow between a reservoir capacitor 265 and a metal contact plug in a conventional apparatus where a single cylindrical reservoir capacitor (or a single lower electrode of the cylindrical reservoir capacitor) is configured to couple with a single contact plug 230, current flows from/to the reservoir capacitor to/from the metal contact plug 270 through the wiring layer 240.

In contrast, in an embodiment of the present invention, current flows through the contiguous lower electrode layer 250 from an edge of the lower electrode layer 250 to the opposite edge of the lower electrode layer 250, where it may flow through a section of the wiring layer 240 that is a significantly shorter path than a conventional apparatus. Such a current path is shown by the direction of the arrow in section 'A' of FIG. 1, which runs across a contiguous portion of the lower electrode 250 before entering the wiring layer 240 and the metal contact plug 270.

As is apparent from the above description, in a semiconductor device and a method for manufacturing the same according to embodiments of the present invention, a cylindrical or concaved lower electrode may be formed in a cell region and a cross-shaped, a meshed, a matrix-type or a lattice-type lower electrode may be formed in a peripheral region as a reservoir capacitor so as to minimize Cs deterioration.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
    a plurality of contact plugs disposed over a semiconductor substrate;
    a wiring layer directly coupled to the plurality of contact plugs;
    a Metal Oxide Semiconductor (MOS) capacitor formed between the semiconductor substrate and the wiring layer;
    a lower electrode directly coupled to the wiring layer;
    a dielectric film and an upper electrode disposed over the lower electrode;
    a first reservoir capacitor contact plug coupled to the upper electrode; and
    a second reservoir capacitor contact plug directly coupled to the wiring layer,
    wherein the lower electrode, the dielectric film and the upper electrode are included in a reservoir capacitor in a peripheral region, the wiring layer is a line type wiring layer, and the lower electrode is a mesh shaped lower electrode.

2. The semiconductor device according to claim 1, wherein the wiring layer covers the plurality of contact plugs of a cell region and the peripheral region.

3. The semiconductor device according to claim 1, wherein the wiring layer includes polysilicon.

4. The semiconductor device according to claim 1, wherein the lower electrode comprises a contiguous body interrupted by a plurality of holes in a regular pattern.

5. The semiconductor device according to claim 1, wherein the lower electrode is formed of titanium (Ti) or a laminated structure of titanium (Ti) and titanium nitride (TiN).

6. The semiconductor device according to claim 1, wherein an electrical conductivity of the wiring layer is lower than an electrical conductivity of the lower electrode.

7. A method for manufacturing a reservoir capacitor of a semiconductor device comprising:
    forming a MOS-type capacitor over a semiconductor substrate;
    forming a plurality of contact plugs over the MOS-type capacitor;
    forming a wiring layer directly on the plurality of contact plugs;
    forming a lower electrode that is directly coupled to the wiring layer;
    forming a dielectric film and an upper electrode over the lower electrode;
    forming a first reservoir capacitor contact plug coupled to the upper electrode; and
    forming a second reservoir capacitor contact plug directly coupled to the wiring layer,
    wherein the lower electrode, the dielectric film and the upper electrode are included in a reservoir capacitor in a peripheral region, the wiring layer is a line-type wiring layer, and the lower electrode has a mesh shape.

8. The method according to claim 7, wherein the wiring layer covers the plurality of contact plugs of a cell region and the peripheral region.

9. The method according to claim 7, wherein the wiring layer includes polysilicon.

10. The method according to claim 7, wherein the lower electrode is formed in a meshed shape comprising a contiguous body interrupted by a plurality of holes in a regular pattern.

11. The method according to claim 7, wherein the lower electrode is formed of titanium (Ti) or a laminated structure of titanium (Ti) and titanium nitride (TiN).

* * * * *